(12) United States Patent
Mizoguchi (10) Patent No.: US 12,339,313 B2
(45) Date of Patent: Jun. 24, 2025

(54) ELECTRICAL TESTING METHOD FOR SEMICONDUCTOR DEVICE

(71) Applicant: RENESAS ELECTRONICS CORPORATION, Tokyo (JP)

(72) Inventor: Osamu Mizoguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 201 days.

(21) Appl. No.: 18/331,472

(22) Filed: Jun. 8, 2023

(65) Prior Publication Data
US 2024/0103069 A1 Mar. 28, 2024

(30) Foreign Application Priority Data

Sep. 22, 2022 (JP) .................. 2022-151944

(51) Int. Cl.
*G01R 31/28* (2006.01)
*G01R 1/04* (2006.01)

(52) U.S. Cl.
CPC ....... *G01R 31/2877* (2013.01); *G01R 1/0433* (2013.01)

(58) Field of Classification Search
CPC .............. G01R 31/2863; G01R 1/0466; G01R 31/2886; G01R 31/2874; G01R 1/0483; G01R 31/2889; G01R 31/2891; G01R 31/26; G01R 31/2601; G01R 1/0458; G01R 1/0433; G01R 1/0408; G01R 31/2875; G01R 31/2877; G01R 31/2896; G01R 1/06722; G01R 1/04; G01R 1/045; G01R 31/2865; G01R 31/2642; G01R 31/28; G01R 31/2849; G01R 31/2851; G01R 1/07371; G01R 31/002; G01R 31/2817; G01R 31/2844; G01R 22/065; G01R 11/04; G01R 31/66; G01R 31/275; G01R 31/317; G01R 31/2872; G01R 31/2881; H01R 2201/20; H01R 33/76; H01R 13/193;
(Continued)

(56) References Cited

U.S. PATENT DOCUMENTS 5,123,850 A * 6/1992 Elder ................... G01R 1/0483
324/750.05
6,064,217 A * 5/2000 Smith ................ G01R 1/06744
324/750.25
(Continued)

FOREIGN PATENT DOCUMENTS

JP      2020-112398 A     7/2020

*Primary Examiner* — Vinh P Nguyen
(74) *Attorney, Agent, or Firm* — Rimon P.C.

(57) ABSTRACT

An electrical test of a semiconductor device is conducted by electrically connecting a plurality of leads of the semiconductor device with a plurality of electrodes of a test board via a plurality of socket terminals of a socket of a test apparatus, respectively. At least a part of the socket is disposed inside a chamber of the test apparatus, and the test board is disposed outside the chamber. The semiconductor device is to be cooled by a cool air circulating in the chamber. The socket has a cavity portion through which the cool air circulating in the chamber can pass, and a part of each of the plurality of socket terminals is exposed in the cavity portion of the socket. The plurality of socket terminals is to be cooled by the cool air passing through the cavity portion of the socket.

11 Claims, 8 Drawing Sheets

(58) Field of Classification Search
CPC .... H01R 13/11; H01R 13/2485; H01R 33/97; H01R 13/10; G06F 1/20; G06F 11/27; G06F 11/3409; G06F 11/2273; G06F 11/26; G06F 13/4068; G01K 7/425
See application file for complete search history.

(56) References Cited

U.S. PATENT DOCUMENTS

| | | | | |
|---|---|---|---|---|
| 6,320,398 | B1 * | 11/2001 | Ito | G01R 1/0466 |
| | | | | 324/757.01 |
| 6,414,510 | B1 * | 7/2002 | Takeuchi | G01R 31/2867 |
| | | | | 324/757.02 |
| 6,626,060 | B2 * | 9/2003 | Matsuo | F16C 1/14 |
| | | | | 74/501.5 R |
| 6,838,897 | B2 * | 1/2005 | Kim | G01R 31/2862 |
| | | | | 324/762.02 |
| 7,008,804 | B2 * | 3/2006 | Song | G01R 31/2874 |
| | | | | 324/750.08 |

* cited by examiner

ELECTRICAL TESTING METHOD FOR SEMICONDUCTOR DEVICE

CROSS-REFERENCE TO RELATED APPLICATIONS

The disclosure of Japanese Patent Application No. 2022-151944 filed on Sep. 22, 2022 including the specification, drawings and abstract is incorporated herein by reference in its entirety.

BACKGROUND

The present invention relates to a method of testing a semiconductor device and a method of manufacturing a semiconductor device and, for example, relates to a technique which is effectively applied to a technique of testing a semiconductor device by bringing a test terminal into contact with an external terminal of the semiconductor device.

There is disclosed a technique listed below.
[Patent Document 1] Japanese Unexamined Patent Application Publication No. 2020-112398

Patent Document 1 discloses a technique that an electrical test of a semiconductor device is conducted by bringing a test terminal into contact with an external terminal of the semiconductor device.

SUMMARY

In a manufacturing process of a semiconductor device, in order to eliminate defective products, an electrical test of the semiconductor device is conducted by bringing a test terminal into contact with an external terminal of the semiconductor device. In addition, the electrical test of the semiconductor device may be conducted at low temperatures, in some cases.

In the electrical test of a semiconductor device conducted at low temperatures, a semiconductor device to be tested is required to be cooled to a predetermined test temperature. If the semiconductor device is not able to be cooled to the predetermined test temperature accurately, reliability of the electrical test of the semiconductor device may be decreased.

Other objects and novel characteristics of the present disclosure will be apparent from the description of the present specification and the accompanying drawings.

According to one embodiment, an electrical test of a semiconductor device is conducted by electrically connecting a plurality of external terminals of the semiconductor device with a plurality of electrodes of a test board via a plurality of test terminals of a socket, respectively, by using a test apparatus including a chamber, the socket, and the test board. At least a part of the socket is disposed inside the chamber, the test board is disposed outside the chamber, and the semiconductor device is to be cooled by a cool air circulating in the chamber. The socket has a cavity portion through which the cool air circulating in the chamber can pass, and a part of each of the plurality of test terminals is exposed in the cavity portion of the socket. The plurality of test terminals is to be cooled by the cool air passing through the cavity portion of the socket.

According to the one embodiment, it is possible to enhance reliability of the electrical test of the semiconductor device.

DETAILED DESCRIPTION

In the embodiment described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiment described below, when referring to the number of elements (including the number of pieces, values, amount, range, and the like), the number of the elements is not limited to a specific number unless otherwise stated or except the case where the number is apparently limited to a specific number in principle. The number larger or smaller than the specific number is also applicable. Further, in the embodiment described below, it goes without saying that the components (including element steps) are not always indispensable unless otherwise stated or except the case where the components are apparently indispensable in principle. Similarly, in the embodiment described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, an embodiment of the present invention will be described in detail with reference to the accompanying drawings. Note that components having the same function are denoted by the same reference symbols throughout the drawings for describing the embodiment, and the repetitive description thereof is omitted. In addition, the description of the same or similar portions is not repeated in principle unless particularly required in the following embodiment.

In addition, in some drawings used in the embodiment, hatching may be omitted even in a cross-sectional view so as to make the drawings easy to see. Also, hatching may be used even in a plan view so as to make the drawings easy to see.

Semiconductor Device

Figure 1:
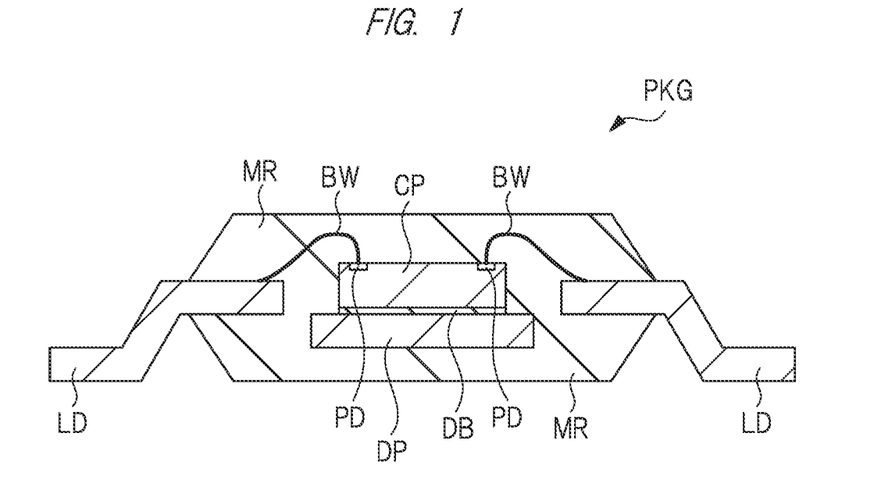
FIG. 1 is a cross-sectional view showing a semiconductor device according to one embodiment of the present invention.

First, a semiconductor device according to the present embodiment will be described by way of example, with reference to FIG. 1. FIG. 1 is a cross-sectional view (cross-sectional side view) of the semiconductor device according to the present embodiment.

As shown in FIG. 1, a semiconductor device PKG according to the present embodiment has a semiconductor chip CP, a die pad (chip mounting portion) DP on which the semiconductor chip CP is mounted, a plurality of leads (lead portions) LD formed of a conductive material, and a sealing portion MR which seals these components.

The sealing portion MR (sealing resin portion) MR is, for example, a resin material such as a thermosetting resin material and also contains a filler or the like. For example, the sealing portion MR can be formed with use of epoxy resin containing a filler.

The plurality of leads LD is formed of a conductive material and preferably, formed of a metal material such as copper (Cu) or a copper alloy. Each of the plurality of leads LD is partially sealed in the sealing portion MR, and the remaining portion of each of the plurality of leads LD protrudes outside the sealing portion MR from a side surface of the sealing portion MR. In the following description, the portion of the lead LD being positioned inside the sealing portion MR is referred to as an inner lead portion, and the other portion of the lead LD being positioned outside the sealing portion MR is referred to as an outer lead portion.

Meanwhile, the semiconductor device PKG in the present embodiment has a structure that the portion of each lead LD (outer lead portion) protrudes from the side surface of the sealing portion MR. The following description will be given on the basis of this structure, but the present embodiment is not limited to this structure. For example, a configuration (QFN type configuration) that each lead LD hardly protrudes from the side surface of the sealing portion MR, and a part of each lead LD is exposed on a lower surface of the sealing portion MR, or the like can also be adopted.

Each outer lead portion of the plurality of leads LD protrudes outside the sealing portion MR, from the side surface of the sealing portion MR. The outer lead portion of each lead LD is subjected to bending processing in such a manner that a lower surface of the outer lead portion near an end thereof is positioned substantially flush with the lower surface of the sealing portion MR. The outer lead portion of the lead LD functions as an external connection terminal (external terminal) of the semiconductor device PKG.

The die pad DP is formed of a conductive material and preferably, formed of a metal material such as copper (Cu) or a copper alloy. On an upper surface of the die pad DP, the semiconductor chip CP is mounted in a state that a front surface thereof faces upward and a back surface thereof faces the die pad DP. The semiconductor chip CP (a back surface thereof) is adhered and fixed to the die pad DP with the adhesive layer (bonding member) DB interposed therebetween. The semiconductor chip CP is sealed inside the sealing portion MR and is not exposed from the sealing portion MR.

The semiconductor chip CP is obtained by, for example, forming various types of semiconductor elements or semiconductor integrated circuits in a main surface of a semiconductor substrate (semiconductor wafer) formed of single-crystal silicon and then dividing the semiconductor substrate into individual pieces as semiconductor chips through dicing or the like.

The semiconductor chip CP has a plurality of pad electrodes PD formed in a front surface thereof. Each of the plurality of pad electrodes PD of the semiconductor chip CP is electrically connected with (an inner lead portion) of each of the plurality of leads LD with a bonding wire BW. In other words, of both ends of each bonding wire BW, one end thereof is connected with the pad electrode PD of the semiconductor chip CP, and the other end thereof is connected with the inner lead portion of each lead LD. The bonding wire BW has a conductive property, and is preferably, formed of a thin metal wire such as a gold (Au) wire, a copper (Cu) wire, or an aluminum (Al) wire. The bonding wire BW is sealed inside the sealing portion MR and is not exposed from the sealing portion MR.

Manufacturing Process of Semiconductor Device

A manufacturing process of a semiconductor device according to the embodiment has a step of preparing a semiconductor device (to-be-tested object) PKG shown in FIG. 1, and a step (testing step) of conducting an electrical test of the semiconductor device (to-be-tested object) PKG shown in FIG. 1.

The step of preparing the semiconductor device PKG includes a step (die bonding step) of mounting the semiconductor chip CP on the die pad DP of a lead frame, and a step (wire bonding step) of, after the die bonding step, electrically connecting the plurality of pad electrodes PD of the semiconductor chip CP with (the inner lead portions of) the plurality of leads LD of the lead frame through the plurality of bonding wires BW. The step of preparing the semiconductor device PKG further includes a step (molding step) of, after the wire bonding step, sealing the semiconductor chip CP, the die pad DP, the plurality of bonding wires BW, and (the inner lead portions of) the plurality of leads LD with the sealing portion MR, a step (lead cutting step) of, after the molding step, cutting the plurality of leads LD from the lead frame, and a step of, after the lead cutting step, performing bending processing on the plurality of leads LD.

In the step of conducting the electrical test of the semiconductor device PKG (testing step), as will be described below, with the use of a test apparatus TS, the electrical test is conducted on the semiconductor device PKG. This step is referred to as an electrical test step or a testing step.

Regarding Test Apparatus

Figure 2:
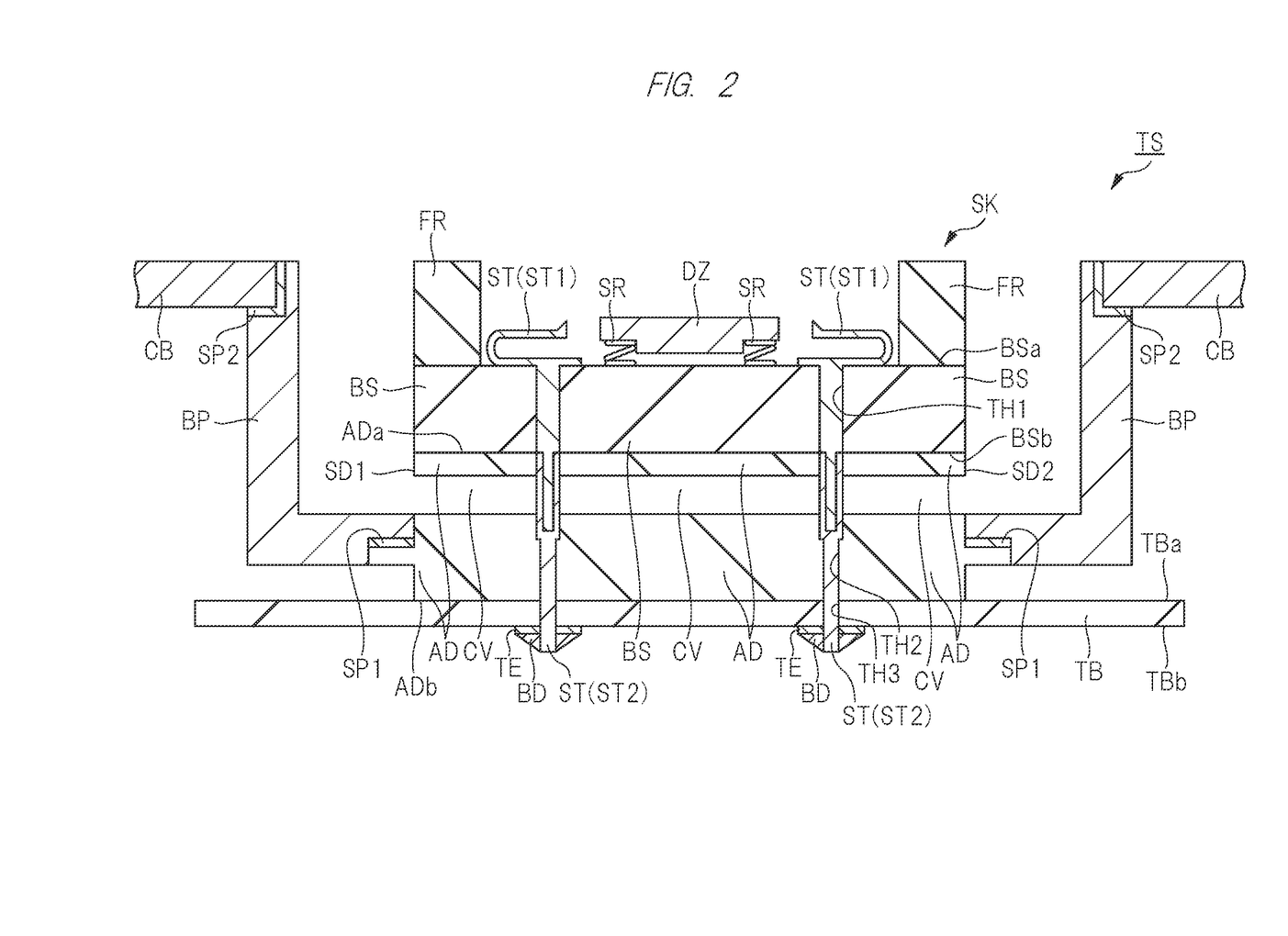
FIG. 2 is an explanatory view showing a part of a test apparatus according to the one embodiment.
Figure 3:
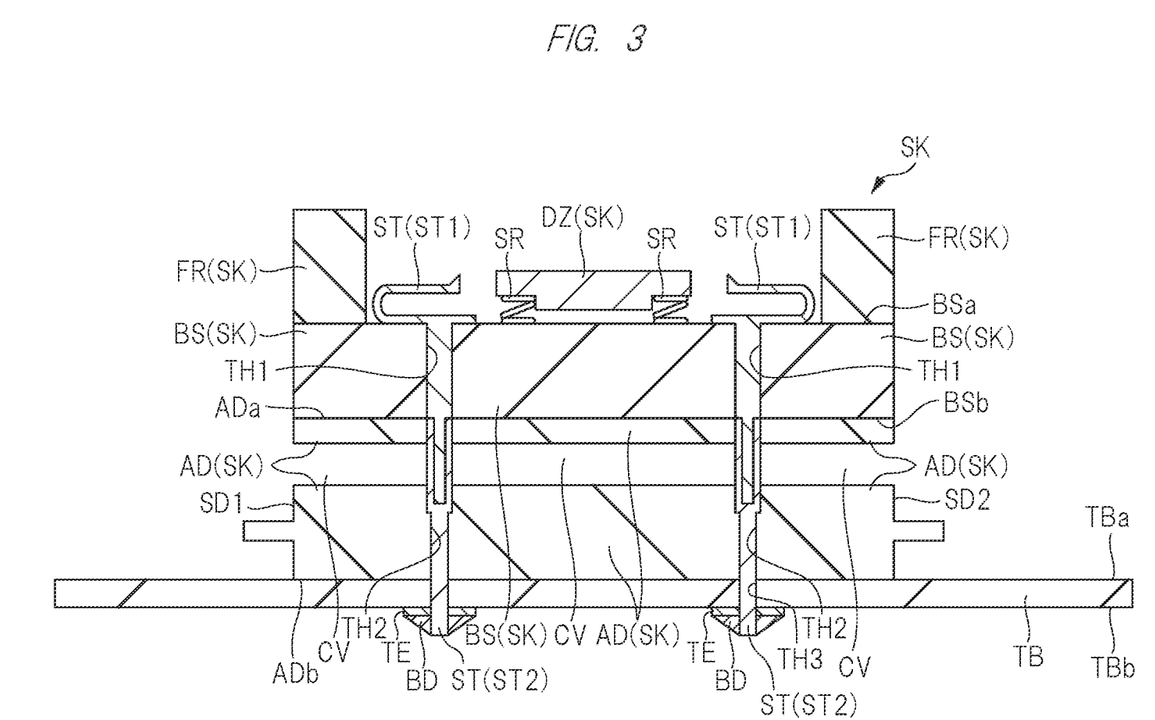
FIG. 3 is an explanatory view showing a test board, a main body portion, and an adapter portion shown in FIG. 2.
Figure 4:
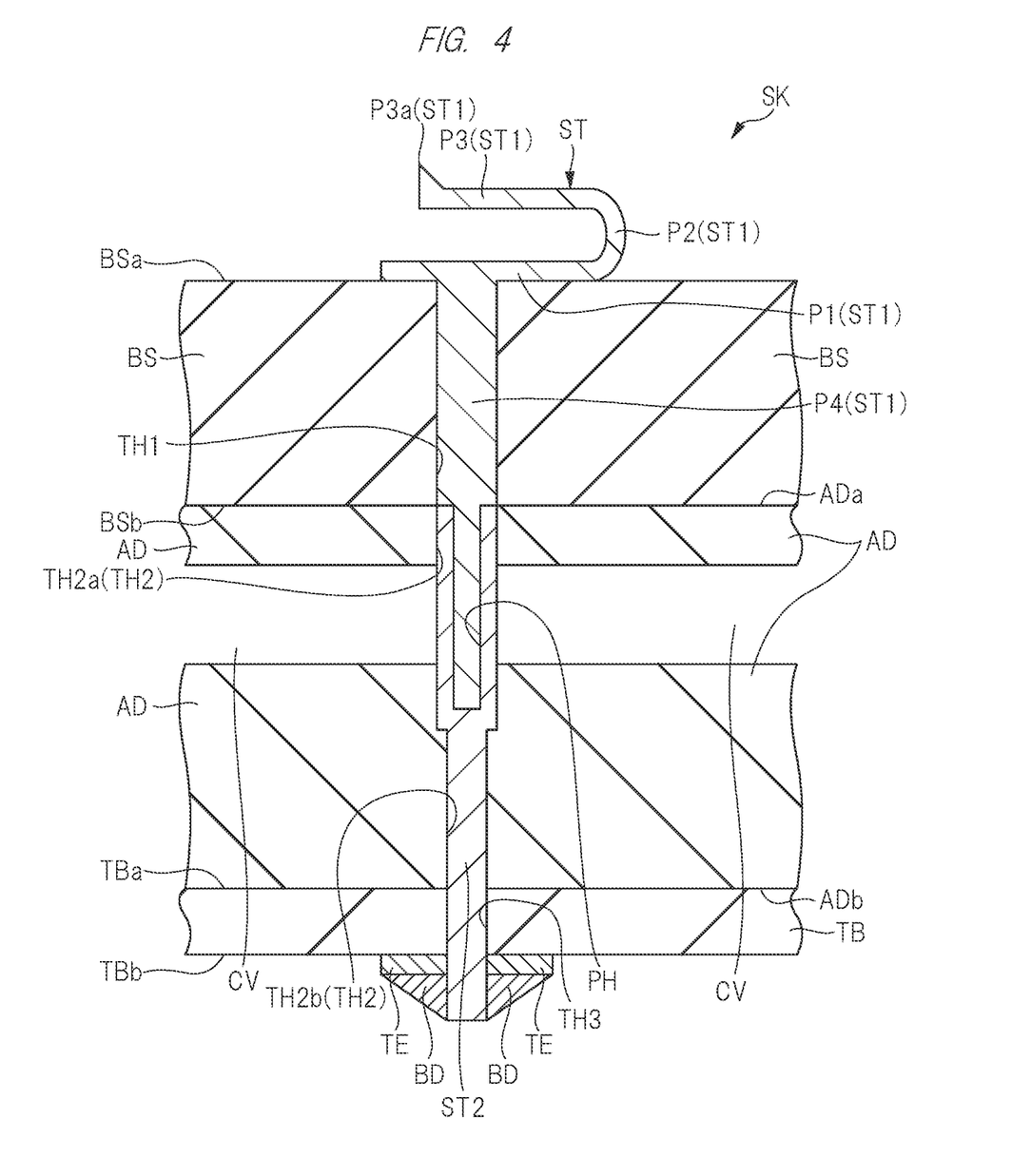
FIG. 4 is a partially enlarged view showing a part of FIG. 2.
Figure 5:
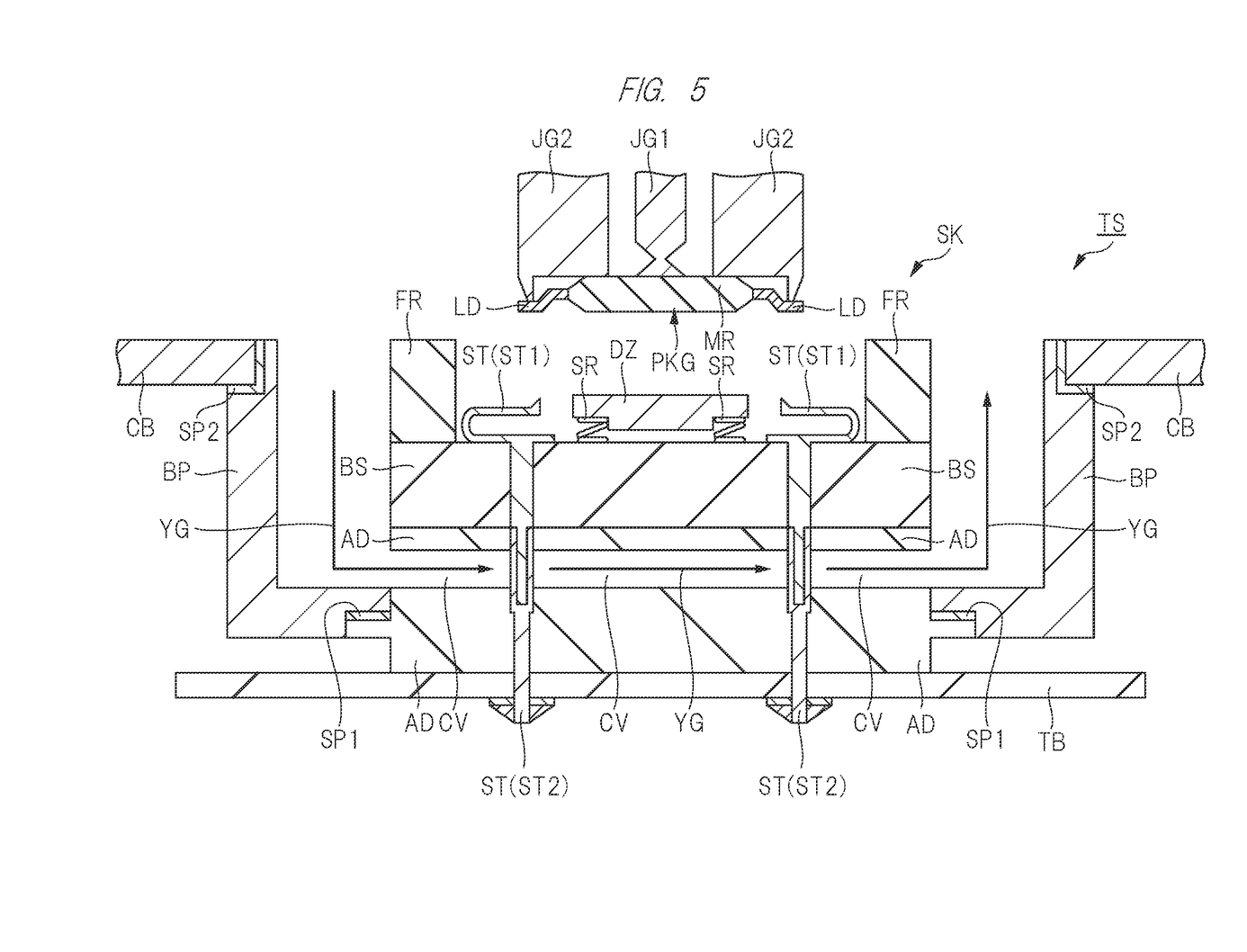
FIG. 5 is an explanatory view showing a testing step for the semiconductor device.
Figure 6:
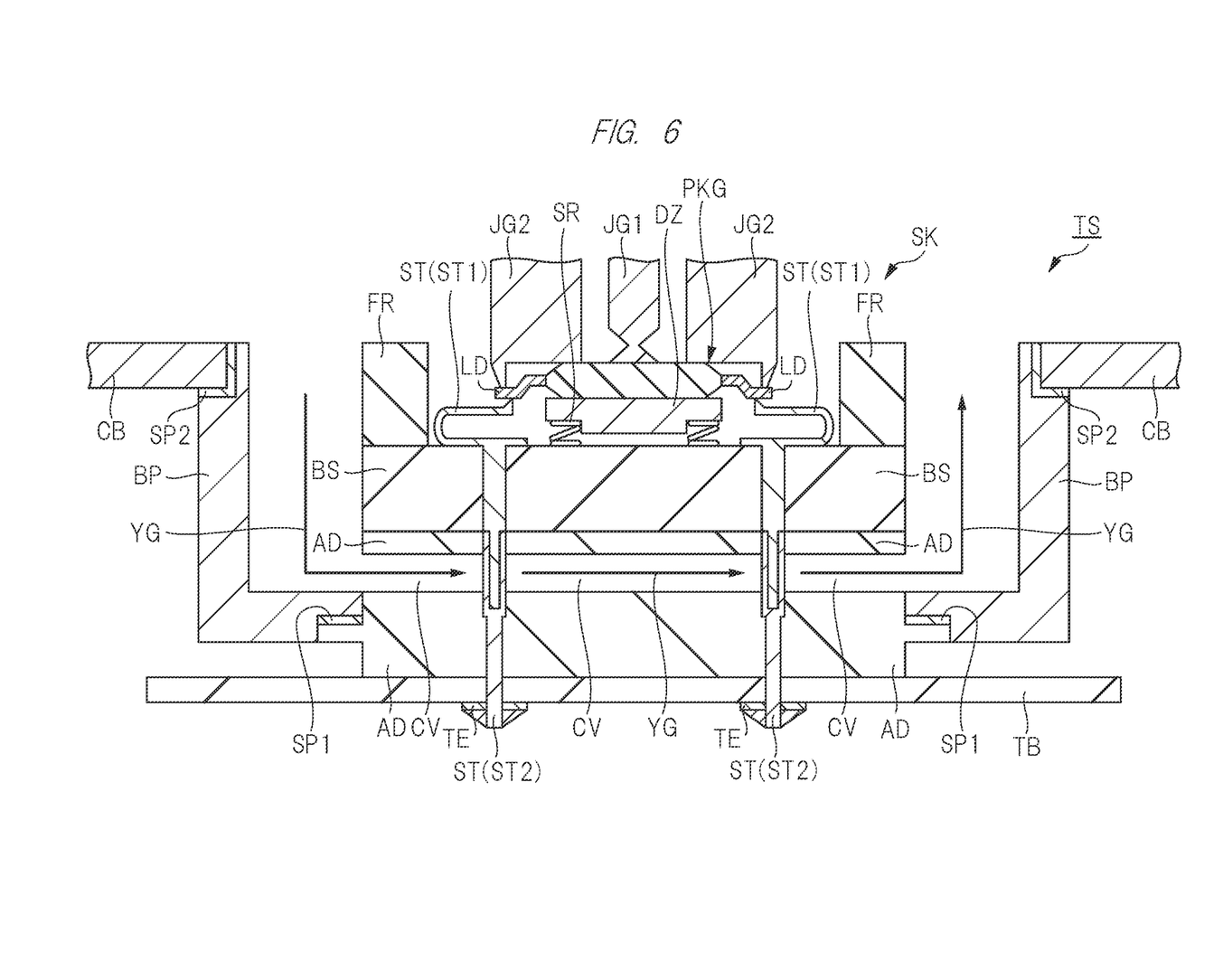
FIG. 6 is an explanatory view showing the testing step for the semiconductor device.
Figure 7:
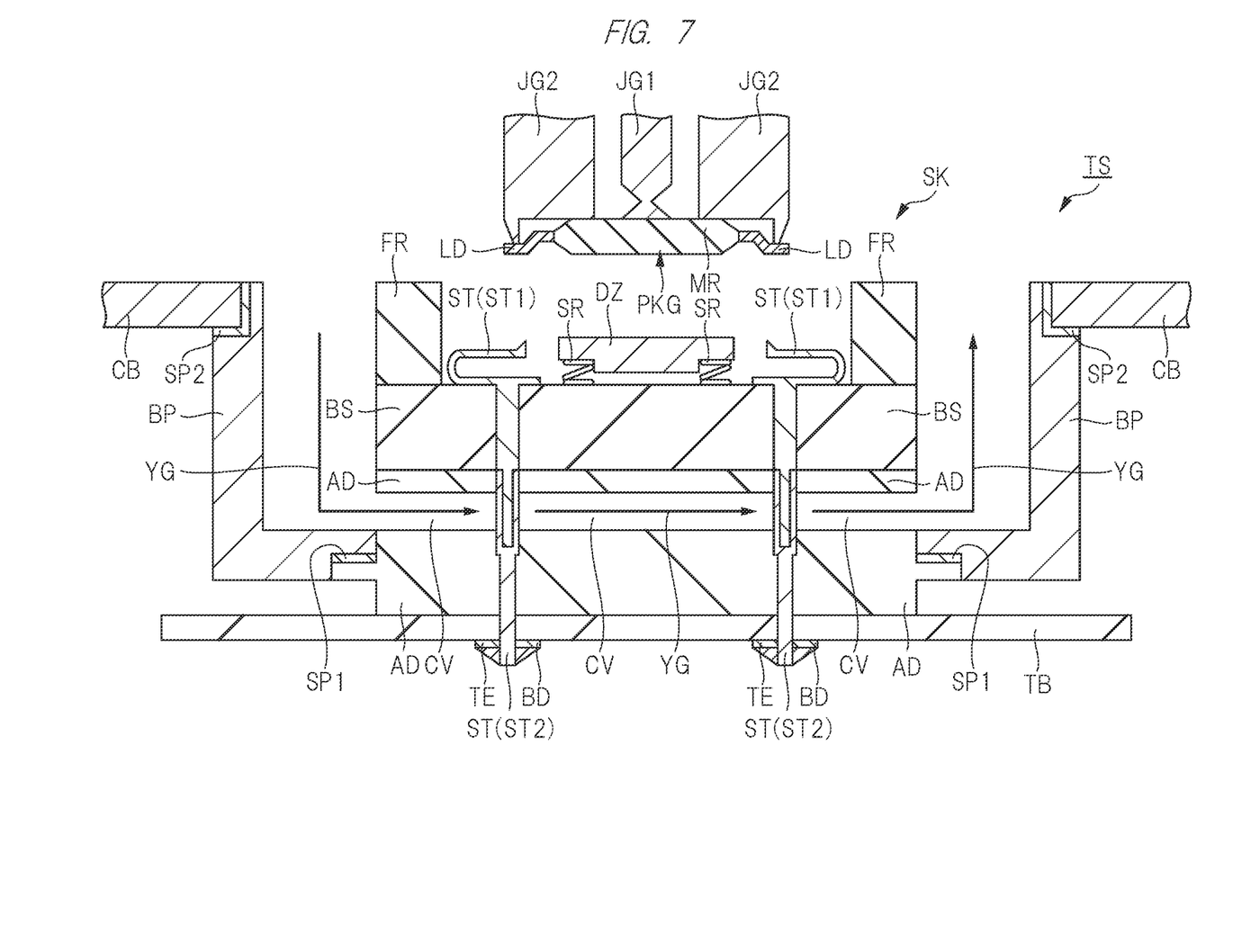
FIG. 7 is an explanatory view showing the testing step for the semiconductor device.

FIG. 2 is an explanatory view (cross-sectional view) showing a part of the test apparatus TS which conducts the electrical test of the semiconductor device PKG. FIG. 3 is an explanatory view (cross-sectional view) showing a test board TB, a plurality of socket terminals ST, a main body portion BS, an outer frame portion FR, and an adapter portion AD which are removed from a chamber. Note that, in the following description, an assembly including the plurality of socket terminals ST, the main body portion BS, the outer frame portion FR, and the adapter portion AD is described as a socket SK. FIG. 4 is a partially enlarged cross-sectional view showing a part of FIG. 2 and illustrates the socket terminal ST and the periphery thereof. FIG. 5 to FIG. 7 are explanatory views each showing the testing step for the semiconductor device PKG and illustrate cross-sectional views each corresponding to FIG. 2. FIG. 5 corresponds to a state in which the semiconductor device PKG to be tested is in the middle of being disposed in the socket SK of the test apparatus TS shown in FIG. 2. FIG. 6 corresponds to a state in which disposing the semiconductor device PKG to be tested in the socket SK of the test apparatus TS shown in FIG. 2 has been completed. In addition, FIG. 7 corresponds to a state in which, as in FIG. 5, after the electrical test is conducted on the semiconductor device PKG disposed in the socket SK of the test apparatus TS, the semiconductor device PKG is being lifted from the socket SK. In addition, in FIG. 5 to FIG. 7, illustration of the semiconductor chip CP, the die pad DP, and the bonding wire BW in the sealing portion MR of the semiconductor device PKG is omitted for simplicity, and accordingly, it is sufficient to refer to FIG. 1 when a structure in the sealing portion MR is needed.

First, with reference to FIG. 2 to FIG. 4, a configuration of the test apparatus (electrical test apparatus) TS for performing the testing step will be described.

The test apparatus TS includes the chamber (a container, a treatment container, a treatment tank, or a handler) for cooling the semiconductor device PKG to be tested by causing cool air to circulate therein, the socket (accommodating portion) SK for accommodating the semiconductor device PKG to be tested, and the test board (a wiring board, or a performance board) TB which is electrically connected with the semiconductor device PKG through the socket SK. FIG. 2 illustrates the socket SK, the test board TB, a base portion CB constituting a part (a bottom portion) of the chamber, and a coupling portion BP which couples the socket SK with the base portion CB.

The test apparatus TS further includes an LSI tester portion (not shown) which is electrically connected with the test board TB. This LSI tester portion includes a control unit and is formed with a control circuit controlling the testing step, a test circuit inputting or outputting signals or test voltages to/from the semiconductor device PKG, or the like. The test circuit formed in the LSI tester portion (control unit) is electrically connected with the semiconductor device PKG through the test board TB and the socket SK.

The test board TB is a wiring board having an upper surface Tba on which the socket SK is mounted, and a lower surface (back surface) TBb positioned on a side opposite to the upper surface TBa. The test board TB has a conductive pattern (conductive layer) including a plurality of electrodes (terminals) TE formed in the lower surface TBb thereof. The plurality of electrodes TE formed in the lower surface TBb of the test board TB is electrically connected with the test circuit formed in the LSI tester portion (control unit) above through wires (not shown) formed in the lower surface TBb of the test board TB, or the like.

The socket SK is disposed on the upper surface TBa of the test board TB. The socket SK includes the plurality of socket terminals (socket pins, test terminals, or test probes) ST, the main body portion (socket main body portion) BS, the outer frame (socket outer frame) FR, and the adapter portion (socket adapter portion) AD.

The main body portion BS has an upper surface BSa, a lower surface BSb on a side opposite to the upper surface BSa, and a plurality of through holes TH1 reaching from the upper surface BSa to the lower surface BSb. The adapter portion AD has an upper surface ADa, a lower surface ADb on a side opposite to the upper surface ADa, a plurality of through holes TH2 reaching from the upper surface ADa to the lower surface ADb, and a cavity portion CV allowing cool air to pass therethrough.

The outer frame portion FR is disposed on the upper surface BSa of the main body portion BS. The main body portion BS is attached to the adapter portion AD such that the lower surface BSb of the main body portion BS faces the upper surface ADa of the adapter portion AD. The main body portion BS is, for example, a plate-shaped member. The lower surface BSb of the main body portion BS may be in contact with the upper surface ADa of the adapter portion AD.

The main body portion BS is attached to the adapter portion AD such that a position of the through hole TH1 of the main body portion BS is aligned with a position of the through hole TH2 of the adapter portion AD with each other. Hence, in plan view, the through hole TH1 of the main body portion BS and the through hole TH2 of the adapter portion AD overlap with each other. From another perspective, the through hole TH1 of the main body portion BS and the through hole TH2 of the adapter portion AD are communicated with each other. Note that, "in plan view" corresponds to a case when viewed in a plan substantially parallel to the upper surface TBa of the test board TB.

The socket terminal ST is a terminal to be used for the electrical test of the semiconductor device and can be regarded as a test terminal. The number of socket terminals ST included in the socket SK can be set to a suitable number according to the semiconductor device PKG to be tested. For example, The number of socket terminals ST included in the socket SK can be set to the number corresponding to the number of external terminals (here, leads LD) of the semiconductor device PKG to be tested. The socket terminal ST is provided in order to electrically connect the lead LD of the semiconductor device PKG with the electrode TE of the test board TB through the socket terminal ST.

Each socket terminal ST has a main body portion (terminal main body portion) ST1 for bringing the socket terminal ST into contact with the lead LD of the semiconductor device PKG, and an adapter portion (terminal adapter portion) ST2 for electrically connecting the main body portion ST1 with the electrode TE of the test board TB.

The main body portion ST1 is a member being integrally formed in whole and has a leaf spring structure. Specifically, as seen in FIG. 4, the main body portion ST1 has a portion P1 extending (being disposed) on the upper surface BSa of the main body portion BS, a plate-like portion (a beam portion, or a cantilever-shaped portion) P3 integrally connected with the portion P1 with a curved portion P2 interposed therebetween, and a portion P4 which is inserted in the through hole TH1 of the main body portion BS, in an integrated manner. Of both ends of the curved portion P2, the plate-like portion P3 is integrally connected to one end thereof, and the portion P1 is integrally connected to the other end thereof. Accordingly, the plate-like portion P3 is supported by the portion P1 with the curved portion P2 interposed therebetween. The portion P1 is present on the upper surface BSa of the main body portion BS, extending along the upper surface BSa of the main body portion BS. One end of the portion P4 is integrally connected to the portion P1.

The plate-like portion P3 includes a tip end P3a protruding toward an upper side which is on a side where the semiconductor device PKG to be tested is to be disposed and is configured such that the tip end P3a is in contact with the lead LD of the semiconductor device PKG to be tested. The main body portion ST1 has the curved portion P2, thereby allowing the main body portion ST1 to be warped as a leaf spring. The curved portion P2 is curved in a half arc shape, for example. When the lead LD of the semiconductor device PKG to be tested is pushed against the tip end P3a of the socket terminal ST and the plate-like portion P3 is warped, contact between the lead LD of the semiconductor device PKG and the tip end P3a of the socket terminal ST can be thereby ensured.

In addition, a case in which the main body portion ST1 has a leaf spring structure has been described here. As an alternative mode, the main body portion ST1 may have a structure other than the leaf spring structure, for example, a pogo pin structure.

The adapter portion ST2 is a rod-like member and has a hole PH provided at one end thereof (an upper end), and a part of the portion P4 (the other end of the portion P4 on the side opposite to the one end connected to the portion P1) of the main body portion ST1 is inserted in this hole PH. In other words, a part (the upper end) of the adapter portion ST2 encloses the part of the main body portion ST1 (the part of the portion P4). This allows the portion P4 of the main body portion ST1 and the adapter portion ST2 to be in contact with each other in the hole PH, so that the main body portion ST1 and the adapter portion ST2 are electrically connected with each other.

In addition, it is also possible to dispose a spring member such as a leaf spring (not shown) in the hole PH of the adapter portion ST2. In this case, the spring member presses the portion P4 of the main body portion ST1 against an inner wall of the hole PH of the adapter portion ST2, and accordingly, the portion P4 of the main body portion ST1 and the adapter portion ST2 are brought into secure contact with each other in the hole PH. In addition, when the spring member is conductive, the spring member is in contact with both the inner wall of the hole PH of the adapter portion ST2 and an outer periphery of the portion P4 of the main body portion ST1, making it possible to secure electrical connection between the main body portion ST1 and the adapter portion ST2.

The main body portion ST1 is removable with respect to the adapter portion ST2. For example, in a case in which the tip end P3a of the main body portion ST1 is brought into contact with a large number of leads LD of the semiconductor device PKG in the testing step and the main body portion ST1 is thereby worn out, the worn main body portion ST1 is removed from the adapter portion ST2 to be replaced with a new main body portion ST1, and the new main body portion ST1 can be attached to the adapter portion ST2.

A part of each socket terminal ST is inserted in the through hole TH1 of the main body portion BS and the through hole TH2 of the adapter portion AD. Specifically, the portion P4 of the main body portion ST1 of the socket terminal ST is inserted from the upper surface BSa side of the main body portion BS into each through hole TH1 of the main body portion BS. In addition, the adapter portion ST2 of the socket terminal ST is inserted in each through hole TH2 of the adapter portion AD. The portion P4 of the main body portion ST1 of each socket terminal ST is inserted in each through hole TH1 of the main body portion BS. However, the part of the portion P4 (the other end of the portion P4 on the side opposite to the one end connected to the portion P1) of the main body portion ST1 protrudes from the lower surface BSb of the main body portion BS and is inserted in the hole PH of the adapter portion ST2 that is disposed in the through hole TH2 of the adapter portion AD. In addition, the adapter portion ST2 of each socket terminal ST is inserted in the through hole TH2 of the adapter portion AD, and a part of each adapter portion ST2 (a lower end of each adapter portion ST2 on the side opposite to the upper end where the hole PH is formed) protrudes from the lower surface ADb of the adapter portion AD and is inserted in the through hole TH3 of the test board TB. The lower end of each adapter portion ST2 inserted in the through hole TH3 of the test board TB is fixed to the test board TB through a conductive bonding member BD such as a solder and is electrically connected with the electrode TE provided in the lower surface TBb of the test board TB. Hence, the electrode TE of the test board TB is electrically connected with the adapter portion ST2 of the socket terminal ST through the conductive bonding member BD, and is electrically connected with the main body portion ST1 of the socket terminal ST through the adapter portion ST2.

In the adapter portion AD, the cavity portion CV is provided across the plurality of through holes TH2. The cavity portion CV is a space through which cool air circulating in the chamber in the testing step can pass. In the case shown in FIG. 2 to FIG. 4, the cavity portion CV of the adapter portion AD penetrates the adapter portion AD so as to extend from a side surface SD1 of the adapter portion AD to a side surface SD2 (side surface SD2 that is opposite to the side surface SD1) of the adapter portion AD. Accordingly, in the adapter portion AD, each of the through holes TH2 is separated by the cavity portion CV, and the separated parts are configured by a through hole portion TH2a provided in a portion of the adapter portion AD above the cavity portion CV and a through hole portion TH2b provided in a portion of the adapter portion AD below the cavity portion CV. The cavity portion CV is present between the through hole portion TH2a and the through hole portion TH2b. A thickness of the cavity portion CV can be set to, for example, approximately 4 mm to 6 mm. Here, the thickness of the cavity portion CV corresponds to the thickness of the cavity portion CV (dimension) in a thickness direction of the adapter portion AD. In addition, the thickness direction of the adapter portion AD corresponds to a direction substantially vertical to the upper surface BSa of the main body portion BS, the lower surface BSb of the main body portion BS, the upper surface ADa of the adapter portion AD, or the lower surface ADb of the main body portion BS.

Note that, in cross-sectional views of FIG. 2 and FIG. 3, it appears that an upper portion and a lower portion of the adapter portion AD are completely separated from each other due to the presence of the cavity portion CV. However, in practice, in a cross-sectional view not shown in FIG. 2 and FIG. 3, the upper portion and the lower portion of the adapter portion AD are continuous (continuous in a region where the cavity portion CV is not formed).

The adapter portion ST2 of each socket terminal ST is inserted in the through hole TH2 of the adapter portion AD, but a part (part of the side surface) of each adapter portion ST2 is exposed in the cavity portion CV. That is, the adapter portion ST2 of each socket terminal ST has a portion positioned in the through hole portion TH2a, a portion positioned in the through hole portion TH2b, a portion being exposed in the cavity portion CV, and a portion protruding from the lower surface ADb of the adapter portion AD, in an integrated manner.

The outer frame portion FR has a package accommodating portion (opening) which is capable of accommodating the semiconductor device PKG therein, and in the testing step, as shown in FIG. 6, the semiconductor device PKG can be disposed in the package accommodating portion of the outer frame portion FR. The package accommodating portion of the outer frame portion FR is surrounded by the outer frame portion FR, in plan view. The main body portion BS is disposed below the package accommodating portion of the outer frame portion FR.

The main body portion BS and the outer frame portion FR can be separate members. Alternatively, they can also be an integrated member. In a case in which the main body portion BS and the outer frame portion FR are separate members, for example, such a structure that the outer periphery of the main body portion BS is surrounded by the outer frame portion FR in plan view can be adopted. The outer frame portion FR, the main body portion BS, and the adapter portion AD are mainly formed of an insulating material such as resin, for example.

A stage (table) DZ for disposing the semiconductor device PKG to be tested is disposed above the upper surface BSa of the main body portion BS. Spring members SR are interposed between the main body portion BS and the stage DZ. In the testing step, when the semiconductor device PKG to be tested is displaced in the package accommodating portion of the socket SK as shown in FIG. 6, the semiconductor device PKG is disposed on the stage DZ.

The socket SK is attached to the chamber such that at least a part of the socket SK is positioned inside the chamber. Specifically, the adapter portion AD of the socket SK is connected and fixed to the coupling portion (base plate) BP constituting a part of the chamber and being coupled with the base portion CB of the chamber with a sponge SP2 interposed therebetween with use of a fixing member such as a screw (not shown). The base portion CB and the coupling portion BP constitute a part of the chamber (bottom portion), defining a space through which the cool air can circulate.

The main body portion BS and the outer frame portion FR of the socket SK are positioned inside the chamber, and the package accommodating portion of the outer frame portion FR is also positioned inside the chamber. Accordingly, in the testing step, the semiconductor device PKG to be tested which is accommodated in the socket SK is also positioned inside the chamber. Accordingly, in the testing step, since the cool air circulates in the chamber, the main body portion BS and the outer frame portion FR of the socket SK are cooled by the cool air circulating in the chamber, and in addition, the semiconductor device PKG to be tested which is accommodated in the socket SK is cooled by the cool air circulating in the chamber.

The adapter portion AD of the socket SK is used in order to attach the socket SK to the coupling portion BP constituting a part of the chamber. The sponge SP1 or the like can also be interposed between the coupling portion BP and the adapter portion AD of the socket SK. Owing to the interposition of the sponge SP1, it is possible to suppress or prevent the cool air from leaking outside the chamber.

The coupling portion BP functions as a part (bottom portion) of the chamber and is detachably attached to the base portion CB of the chamber. The coupling portion BP is connected and fixed to the base portion CB of the chamber with use of a fixing member such as a screw (not shown). It is also possible to have the sponge SP2 or the like interposed between the base portion CB of the chamber and the coupling portion BP. Owing to the interposition of the sponge SP2, it is possible to suppress or prevent the cool air from leaking outside the chamber.

In the testing step, as shown in FIG. 2, although the socket SK is attached to the chamber, when the socket SK needs maintenance or the like, as shown in FIG. 3, the socket SK can be removed from the chamber. For example, the coupling portion BP having the socket SK attached thereto is removed from the base portion CB of the chamber, and thereafter, the socket SK can be removed from the coupling portion BP. After the maintenance of the socket SK is ended, the socket SK is first attached to the coupling portion BP, and then, the coupling portion BP having the socket SK attached thereto can be attached to the base portion CB of the chamber.

In a state in which the socket SK is attached to the chamber (a state in FIG. 2), the cavity portion CV of the adapter portion AD is positioned inside the chamber. As such, in the testing step, the cool air circulating in the chamber can pass through the cavity portion CV of the adapter portion AD. Hence, in the testing step, an exposed portion of the adapter portion ST2 in the cavity portion CV of the adapter portion AD is cooled by contact with the cool air circulating in the chamber.

In addition, even in a state in which the socket SK is attached to the chamber (the state in FIG. 2), the test board TB is positioned outside the chamber. Hence, in the testing step, the cool air circulates in the chamber, but the test board TB is not in contact with the cool air circulating in the chamber. Accordingly, the test board TB is not cooled by the cool air circulating in the chamber.

Regarding Testing Step

The testing step which conducts the electrical test of the semiconductor device PKG will be described with use of the test apparatus TS.

First, the test apparatus TS is prepared. Preparation of the test apparatus TS may be carried out before or after preparation of the semiconductor device PKG to be tested, and alternatively, may be carried out at the same time as the preparation of the semiconductor device PKG to be tested. The configuration of the test apparatus TS has been described above, and hence, a repetitive description thereof is omitted here.

The testing step described here is a low-temperature testing step in which the electrical test of the semiconductor device PKG is conducted at low test temperatures. As such, the semiconductor device PKG to be tested needs to be cooled to a predetermined test temperature, and cooling of the semiconductor device PKG is carried out by the cool air circulating in the chamber. Accordingly, in the testing step, the cool air is circulating in the chamber of the test apparatus TS. The cool air is cooled gas (gas having a low temperature). A suitable example of the cool air is cooled air. For example, a coolant such as liquid nitrogen is used to cool the air, so that the cool air can be generated. The cool air can be generated in the chamber, and it is also possible to introduce the cool air generated outside the chamber into the interior of the chamber. In the chamber, for example, with use of an air blower or the like, it is possible to make cool air circulate. The cool air circulating in the chamber has a function of cooling the semiconductor device PKG to be tested in the chamber. In the testing step, the semiconductor device PKG to be tested is cooled to be a temperature equal to or less than −20° C., for example, by the cool air circulating in the chamber.

In the testing step, as shown in FIG. 6, in the chamber, the semiconductor device PKG to be tested is disposed in the package accommodating portion of the socket SK of the test apparatus TS. For example, as shown in FIG. 5, a suction jig JG1 sucks the semiconductor device PKG, and the semiconductor device PKG sucked by the suction jig JG1 is disposed in the package accommodating portion of the socket SK in the chamber as shown in FIG. 6. At this time, the semiconductor device PKG is disposed in the package accommodating portion of the socket terminal ST such that the tip end P3a of the main body portion ST1 of the socket terminal ST (see FIG. 4) and the lead LD of the semiconductor device PKG are opposed to each other. In a case in which the stage DZ is above the main body portion BS, the semiconductor device PKG is disposed on the stage DZ. Then, pressing jigs JG2 or the like press the semiconductor device PKG, pushing the semiconductor device PKG downward (toward the main body portion BS). Owing to this, the main body portion ST1 of the socket terminal ST is warped, and as a result, the tip end P3a of the main body portion ST1 of the socket terminal ST (see FIG. 4) is in secure contact with the lead LD of the semiconductor device PKG to establish electrical connection therebetween. Note that, since the spring members SR are interposed between the main body portion BS and the stage DZ, the semiconductor device PKG is pushed by the pressing jigs JG2 or the like, making it possible to cause the stage DZ to be lowered along with the semiconductor device PKG on the stage DZ.

As a result, the tip end P3a of the main body portion ST1 of each socket terminal ST (see FIG. 4) is in electrical contact with the lead LD of the semiconductor device PKG, and the adapter portion ST2 of each socket terminal ST is electrically connected with the electrode TE of the test board TB. Owing to this, the lead LD of the semiconductor device PKG and the electrode TE of the test board TB are electrically connected with each other via the socket terminal ST, and the plurality of leads LD of the semiconductor device PKG is electrically connected through the plurality of socket terminals ST and conductive portions (including the electrodes TE) of the test board TB with the test circuit formed in the LSI tester portion (control unit) of the test apparatus TS. In addition, the semiconductor device PKG is cooled to be a predetermined test temperature by the cool air circulating in the chamber.

In this state, from the test circuit, through the test board TB, the socket terminal ST, and the lead LD of the semiconductor device PKG, a current or a voltage is supplied to the semiconductor chip CP included in the semiconductor device PKG, thereby making it possible to conduct the electrical test of the semiconductor device PKG. For example, by measuring electrical characteristics of the semiconductor device PKG, the quality of the electrical characteristics of the semiconductor device PKG is tested. The socket terminal ST is used as a transmission path through which a current or a voltage input from the electrode TE of the test board TB is transmitted to the lead LD of the semiconductor device PKG.

In actual implementation, since the semiconductor device PKG has the plurality of leads LD and the socket SK has the plurality of socket terminals ST, the plurality of leads LD of the semiconductor device PKG and the plurality of socket terminals ST of the socket SK are brought into electrical contact with each other, thereby conducting the electrical test of the semiconductor device PKG.

Thereafter, application of a pressing force by the pressing jigs JG2 or the like to the semiconductor device PKG is released, and the semiconductor device PKG having finished taking the electrical test is lifted up along with the jigs JG1 and JG2 as shown in FIG. 7, to be taken out from the socket SK. Then, another semiconductor device PKG to be tested next is disposed in the package accommodating portion of the socket SK as in FIG. 5 and FIG. 6, and the electrical test of the semiconductor device PKG is conducted. Repeating this, a plurality of semiconductor devices PKG can sequentially be subjected to the electrical test.

In the testing step, the cool air circulating in the chamber passes through the cavity portion CV of the adapter portion AD. In FIG. 5 to FIG. 7, a flow of the cool air passing through the cavity portion CV of the adapter portion AD is schematically indicated with an arrow denoted by a reference sign YG. Accordingly, in the testing step, the exposed portion of the socket terminal ST (more specifically, the adapter portion ST2) in the cavity portion CV of the adapter portion AD is cooled by contact with the cool air circulating in the chamber.

Regarding Study Example

Figure 8:
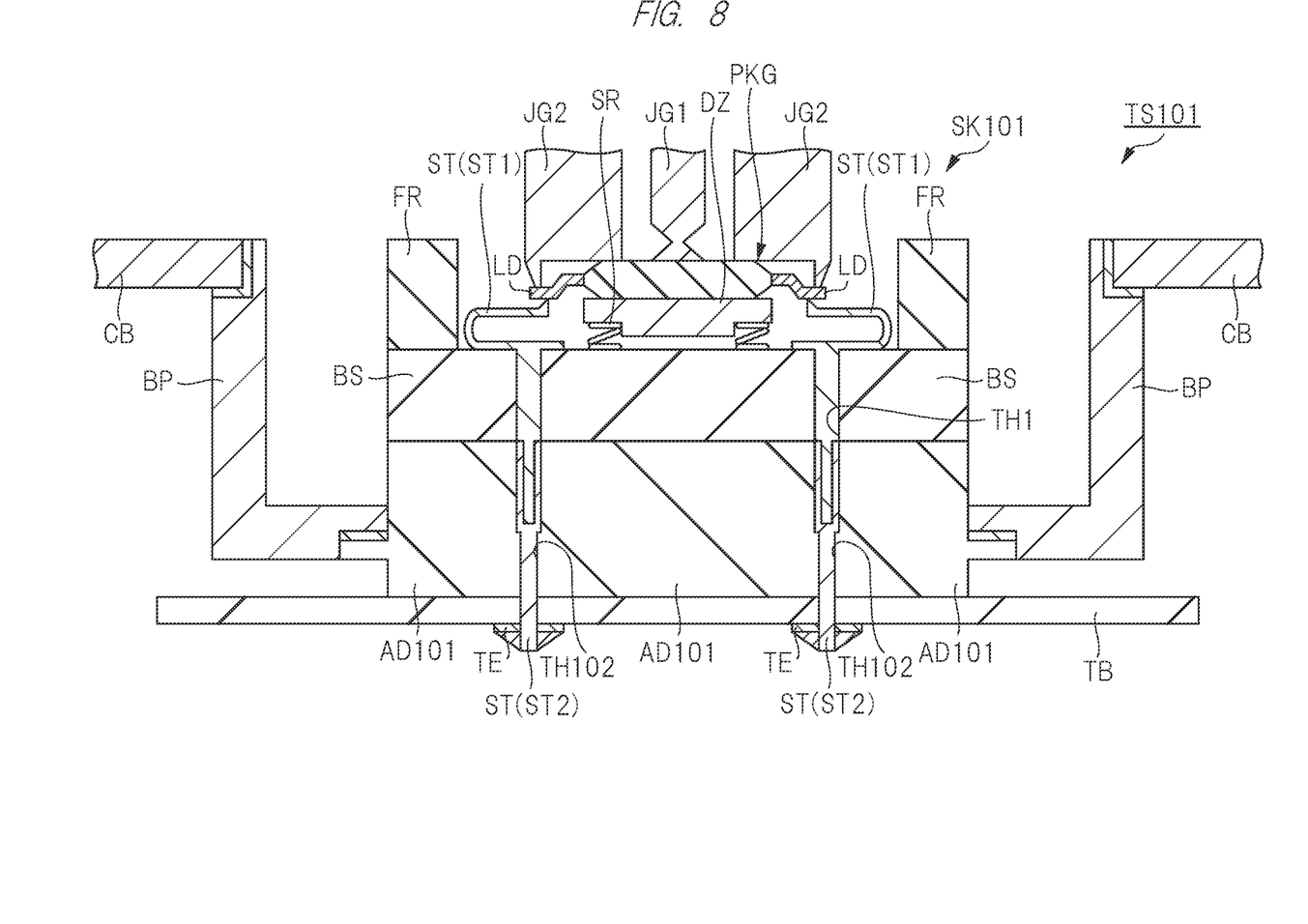
FIG. 8 is an explanatory view showing a test apparatus according to a study example.

FIG. 8 is an explanatory view (cross-sectional view) showing a part of a test apparatus TS101 according to a study example having studied by the present inventor and corresponds to FIG. 6 above.

In the case of the test apparatus TS101 according to the study example shown in FIG. 8, a socket SK101 corresponding to the socket SK described above has an adapter portion AD101 corresponding to the adapter portion AD described above, but the adapter portion AD101 according to the study example does not have a constituent element corresponding to the cavity portion CV described above. Hence, in the case of the study example shown in FIG. 8, a through hole TH102 of the socket SK101 is formed continuously from an upper surface of the adapter portion AD101 to a lower surface of the adapter portion AD101. Since other configurations of the test apparatus TS101 according to the study example are almost same as those in the test apparatus TS above, a repetitive description thereof is omitted here.

According to the study made by the present inventor, in the case of conducting the electrical test of the semiconductor device with use of the test apparatus TS101 shown in FIG. 8, it became clear that the following problems occur.

The present inventor has studied the low-temperature testing step. In a case in which the low-temperature testing step is carried out with use of the test apparatus TS101 according to the study example shown in FIG. 8, the semiconductor device PKG to be tested is cooled to be a predetermined test temperature by the cool air circulating in the chamber. Although the interior of the chamber can be cooled by the cool air circulating in the chamber, the cool air circulating in the chamber cannot cool the exterior of the chamber. Owing to this, a temperature of the test board TB positioned outside the chamber is considerably higher than the temperature of the semiconductor device PKG to be tested. In addition, in the testing step, by electrically connecting the electrode TE of the test board TB with the lead LD of the semiconductor device PKG via the socket terminal ST, the electrical test is conducted on an object to be tested. Accordingly, heat transfers from the test board TB through the socket terminal ST to the lead LD of the semiconductor device PKG, causing the temperature of the semiconductor device PKG to be tested to become higher than the predetermined test temperature, upon conducting the electrical test. In addition, when the semiconductor device PKG to be tested is disposed in the package accommodating portion of the socket SK101 of the test apparatus TS101, the semiconductor device PKG is surrounded by the outer frame portion FR of the socket SK101 and the jigs JG1 and JG2, making it difficult for the semiconductor device PKG to be in contact with the cool air. Hence, when the heat transfers from the test board TB through the socket terminal ST to the lead LD of the semiconductor device PKG, the temperature of the semiconductor device PKG is likely to be higher.

When the temperature of the semiconductor device to be tested becomes higher than the predetermined test temperature, reliability of the low-temperature testing step decreases, causing reduction in reliability of the semiconductor device. In order to enhance reliability of the electrical test of the semiconductor device and therefore to enhance reliability of the semiconductor device, it is demanded that the electrical test of the semiconductor device can be conducted in a state in which the semiconductor device to be tested maintains the predetermined test temperature.

Main Features and Advantageous Effects

In the present embodiment, the test apparatus TS to be used in the testing step includes the chamber, the socket SK having the plurality of socket terminals ST, and the test board TB having the plurality of electrodes TE. At least a part of the socket SK is disposed inside the chamber, the test board TB is disposed outside the chamber, and the semiconductor device PKG to be tested is cooled by the cool air circulating in the chamber. In the testing step, the plurality of leads LD of the semiconductor device PKG is electrically connected with the plurality of electrodes TE of the test board TB through the plurality of socket terminals ST, respectively, and the electrical test of the semiconductor device PKG is conducted.

One of the main features of the present embodiment is that the socket SK of the test apparatus TS has the cavity portion CV through which the cool air circulating in the chamber can pass and a part of each of the plurality of socket terminals ST of the socket SK is exposed in the cavity portion CV of the socket SK. The plurality of socket terminals ST of the socket SK is cooled by the cool air passing through the cavity portion CV of the socket.

As has been described in the paragraph of "REGARDING STUDY EXAMPLE" above, in the test apparatus TS, since the test board TB is positioned outside the chamber, the cool air circulating in the chamber cannot cool the test board TB positioned outside the chamber, and the temperature of the test board TB positioned outside the chamber is considerably higher than the temperature of the semiconductor device PKG to be tested. In addition, in the testing step, the electrode TE of the test board TB and the lead LD of the semiconductor device PKG are electrically connected with each other through the socket terminal ST, so that the electrical test of the object to be tested is conducted. Accordingly, heat transfers from the test board TB through the socket terminal ST to the lead LD of the semiconductor device PK, causing the temperature of the semiconductor device PKG to be tested to be higher than the predetermined test temperature, upon conducting the electrical test.

In contrast, in the present embodiment, the socket SK of the test apparatus TS has the cavity portion CV through which the cool air circulating in the chamber can pass, and accordingly, a part of each of the plurality of socket terminals ST of the socket SK is exposed in the cavity portion CV of the socket SK. As a result, the plurality of socket terminals ST of the socket SK is cooled by the cool air passing through the cavity portion CV of the socket. That is, the exposed portion of the socket terminal ST (more specifically, the adapter portion ST2) in the cavity portion CV is in contact with the cool air circulating in the chamber to be cooled thereby. Consequently, it is possible to suppress heat from transferring from the test board TB through the socket terminal ST to the lead LD of the semiconductor device PKG, so that the temperature of the semiconductor device PKG to be tested can be maintained to the predetermined test temperature accurately, upon conducting the electrical test.

In other words, the heat transferring from the test board TB through the conductive bonding member BD to the socket terminal ST further transfers through the socket terminal ST to the lead LD of the semiconductor device PKG, which may become the cause of the temperature rise of the semiconductor device PKG. However, in the present embodiment, the exposed portion of the socket terminal ST in the cavity portion CV is cooled by the cool air, thereby suppressing or preventing the heat from transferring from the test board TB to the semiconductor device PKG side through the socket terminal ST, passing over the exposed portion of the socket terminal ST in the cavity portion CV. As a result, upon conducting the electrical test, the temperature of the semiconductor device PKG to be tested can be maintained to be the predetermined test temperature accurately. Accordingly, reliability of the electrical test of the semiconductor device can be enhanced, and consequently, reliability of the semiconductor device can be enhanced.

The socket SK has the cavity portion CV through which the cool air circulating in the chamber can pass, and at least a part of the socket SK is disposed inside the chamber. Specifically, the socket SK includes the adapter portion AD connected with the chamber and the main body portion BS disposed on the adapter portion AD, and the main body portion BS is positioned inside the chamber. The main body portion BS has the plurality of through holes TH1 in which the plurality of socket terminals ST is inserted, respectively, and the adapter portion AD has the plurality of through holes TH2 in which the plurality of socket terminals ST is inserted, respectively. In the adapter portion AD, each of the plurality of through holes TH2 is separated by the cavity portion CV. Accordingly, in the cavity portion CV of the adapter portion AD, a part of each socket terminal ST is exposed, and this exposed portion thereof can be cooled by the cool air passing through the cavity portion CV.

It is preferable to provide the cavity portion CV of the socket SK in the adapter portion AD, not in the main body portion BS. That is, it is preferable that not the main body portion ST1 of the socket terminal ST but the adapter portion ST2 of the socket terminal ST is exposed in the cavity portion CV of the socket SK. Compared to a case in which the cavity portion CV is provided in the main body portion BS, in a case in which the cavity portion CV is provided in the adapter portion AD, the socket terminal ST can be cooled at a position much closer to the test board TB by the cool air (the cool air passing through the cavity portion CV), so that the heat transferring from the test board TB through the socket terminal ST to the semiconductor device PKG can be suppressed or prevented more efficiently. As a result, upon conducting the electrical test, the temperature of the semiconductor device PKG to be tested can be maintained to be the predetermined test temperature more accurately. Thus, reliability of the electrical test of the semiconductor device can be further enhanced, and consequently, reliability of the semiconductor device can be further enhanced.

The adapter portion AD has the side surface SD1 and the side surface SD2, and the cavity portion CV of the adapter portion AD is formed so as to extend from the side surface SD1 of the adapter portion AD to the side surface SD2 thereof. As such, the cool air can pass through the cavity portion CV so as to move from one of the side surfaces SD1 and SD2 of the adapter portion AD to the other one, so that the exposed portion of each socket terminal ST in the cavity portion CV can be cooled by the cool air efficiently.

In addition, more preferably, the side surface SD1 and the side surface SD2 of the adapter portion AD are opposed to each other. Accordingly, the cool air is more likely to pass through the cavity portion CV, so that the exposed portion of each socket terminal ST in cavity portion CV can be cooled by the cool air more efficiently.

Each of the plurality of socket terminals ST of the socket SK has the main body portion ST1 and the adapter portion ST2. At least a part of the main body portion ST1 is inserted in the through hole TH1 of the main body (socket main body) BS. At least a part of the adapter portion ST2 is inserted in the through hole TH2 of the adapter portion (socket adapter portion) AD. As for each of the plurality of socket terminals ST of the socket SK, the main body portion ST1 and the adapter portion ST2 are electrically connected, and a part of the adapter portion ST2 is exposed in the cavity portion CV of the adapter portion AD of the socket SK. In the testing step, the main body portion ST1 is in electrical contact with the lead LD of the semiconductor device PKG. The adapter portion ST2 is electrically connected with the electrode TE of the test board TB via the conductive bonding member BD. Since each socket terminal ST includes the main body portion ST1 and the adapter portion ST2, handling of the socket SK and the socket terminal ST becomes easy.

That is, since the adapter portion ST2 of the socket terminal ST is electrically connected with the electrode TE of the test board TB via the conductive bonding member BD such as a solder (hence, the adapter portion ST2 of the socket terminal ST is fixed to the test board TB), it is not easy to take the adapter portion ST2 of the socket terminal ST off from the test board TB. However, in the testing step, it is the main body portion ST1 of the socket terminal ST, not the adapter portion ST2 of the socket terminal ST, to be in contact with the lead LD of the semiconductor device PKG repeatedly. As a result, the repeated contact with the lead LD causes occurrence of wear in the main body portion ST1 of the socket terminal ST, not in the adapter portion ST2 of the socket terminal ST, requiring maintenance or replacement for the main body portion ST1 of the socket terminal ST. The main body portion ST1 of the socket terminal ST is not fixed to the test board TB with a solder or the like, and the main body portion ST1 of the socket terminal ST can easily be removed from the adapter portion ST2 of the socket terminal ST, and in addition, it is also easy to remove the main body portion BS of the socket SK from the adapter portion ST2 of the socket SK. Since the socket terminal ST includes the adapter portion ST2 that is electrically connected with the electrode TE of the test board TB via the conductive bonding member BD and the main body portion ST1 that is brought into contact with the lead LD of the semiconductor device PKG, the main body portion BS of the socket SK or the main body portion ST1 of the socket terminal ST can easily be removed as needed, so that maintenance or replacement of the main body portion ST1 of the socket terminal ST can easily be carried out.

Of each socket terminal ST, one end of the main body portion ST1 is inserted in the hole PH provided in one end of the adapter portion ST2. Hence, electrical connection between the main body portion ST1 and the adapter portion ST2 can be ensured, and accordingly, the main body portion ST1 of the socket terminal ST can easily be removed from the adapter portion ST2 of the socket terminal ST.

In addition, in the present embodiment, a case in which the lead is adopted as the external terminal of the semiconductor device with which the socket terminal ST is brought into contact has been described by way of example. As another alternative, as the external terminal of the semiconductor device with which the socket terminal ST is brought into contact, a ball electrode (bump electrode) such as a solder ball (solder bump) other than the lead, can also be adopted, for example. Accordingly, the semiconductor device to be tested may be a BGA (Ball Grid Array) type semiconductor package or the like.

In addition, in the present embodiment, a case in which one socket SK is attached to the coupling portion BP constituting a part of the chamber has been described. However, as an alternative, a plurality of sockets SK may be attached to the coupling portion BP constituting a part of the chamber. In this case, the electrical test of the semiconductor device PKG is conducted in each of the plurality of sockets SK.

In the foregoing, the invention made by the inventor of the present invention has been specifically described based on the embodiment. However, it is needless to say that the present invention is not limited to the foregoing embodiment and various modifications and alterations can be made within the gist of the present invention.

What is claimed is:

1. A method of testing a semiconductor device, comprising steps of:
   (a) preparing the semiconductor device having a plurality of external terminals;
   (b) preparing a test apparatus including a chamber, a socket having a plurality of test terminals, and a test board having a plurality of electrodes; and
   (c) electrically connecting the plurality of external terminals of the semiconductor device with the plurality of electrodes of the test board via the plurality of test terminals, respectively, and conducting an electrical test of the semiconductor device,
   wherein at least a part of the socket is disposed inside the chamber,
   wherein the test board is disposed outside the chamber,
   wherein, in the step of (c), the semiconductor device is to be cooled by a cool air circulating in the chamber,
   wherein the socket has a cavity portion through which the cool air circulating in the chamber is able to pass,
   wherein a part of each of the plurality of test terminals is exposed in the cavity portion of the socket, and
   wherein the plurality of test terminals is to be cooled by the cool air passing through the cavity portion of the socket.

2. The method of testing a semiconductor device according to claim 1,
   wherein the socket includes a socket adapter portion connected with the chamber, and a socket main body portion disposed on the socket adapter portion,
   wherein the socket main body portion is disposed inside the chamber, and
   wherein the cavity portion is formed in the socket adapter portion.

3. The method of testing a semiconductor device according to claim 2,
   wherein the socket main body portion has a plurality of first through holes in which the plurality of test terminals is inserted, respectively, and
   wherein the socket adapter portion has a plurality of second through holes in which the plurality of test terminals is inserted, respectively.

4. The method of testing a semiconductor device according to claim 3,
   wherein each of the plurality of test terminals has a terminal main body portion at least a part of which is inserted in the first through hole of the socket main body portion, and a terminal adapter portion at least a part of which is inserted in the second through hole of the socket adapter portion, and
   wherein, in each of the plurality of test terminals, the terminal main body portion and the terminal adapter portion are electrically connected with each other, and a part of the terminal adapter portion is exposed in the cavity portion of the socket adapter portion.

5. The method of testing a semiconductor device according to claim 4,
   wherein, in the socket adapter portion, each of the plurality of second through holes is separated by the cavity portion.

6. The method of testing a semiconductor device according to claim 4,
   wherein, in the step of (c), the terminal main body portion is electrically connected with the external terminal of the semiconductor device, and
   wherein the terminal adapter portion is electrically connected with the electrode of the test board via a conductive bonding member.

7. The method of testing a semiconductor device according to claim 6,
wherein the bonding member is a solder.

8. The method of testing a semiconductor device according to claim 6,
wherein, in each of the plurality of test terminals, one end of the terminal main body portion is inserted in a hole provided in one end of the terminal adapter portion.

9. The method of testing a semiconductor device according to claim 2,
wherein the socket adapter portion has a first side surface and a second side surface, and
wherein the cavity portion of the socket adapter portion is formed so as to extend from the first side surface of the socket adapter portion to the second side surface of the socket adapter portion.

10. The method of testing a semiconductor device according to claim 9,
wherein the first side surface and the second side surface in the socket adapter portion are positioned to be opposed to each other.

11. The method of testing a semiconductor device according to claim 1,
wherein, in the step of (c), the semiconductor device is cooled to be a temperature equal to or less than −20° C. by the cool air circulating in the chamber.

\* \* \* \* \*